US010283397B2

(12) United States Patent
Willwerth et al.

(10) Patent No.: US 10,283,397 B2
(45) Date of Patent: May 7, 2019

(54) SUBSTRATE LIFT PIN ACTUATOR

(71) Applicant: Applied Materials, Inc., Santa Clara, CA (US)

(72) Inventors: Michael D. Willwerth, Campbell, CA (US); Roberto Cesar Cotlear, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 351 days.

(21) Appl. No.: 15/135,496

(22) Filed: Apr. 21, 2016

(65) Prior Publication Data
US 2017/0032997 A1 Feb. 2, 2017

Related U.S. Application Data

(60) Provisional application No. 62/197,476, filed on Jul. 27, 2015.

(51) Int. Cl.
*H01L 21/687* (2006.01)
*B66F 3/25* (2006.01)
*H01L 21/683* (2006.01)
*B66F 3/24* (2006.01)

(52) U.S. Cl.
CPC .......... *H01L 21/68742* (2013.01); *B66F 3/25* (2013.01); *H01L 21/6875* (2013.01); *B66F 3/24* (2013.01); *B66F 3/247* (2013.01); *H01L 21/6831* (2013.01)

(58) Field of Classification Search
CPC ......... H01L 21/68742; H01L 21/68792; H01L 2221/68318; H01L 21/6875; B66F 3/247; B66F 3/24; B66F 3/35; C23C 16/4586
See application file for complete search history.

(56) References Cited

U.S. PATENT DOCUMENTS 3,635,811 A * 1/1972 Lane ................. B05D 1/62
204/192.11
5,203,445 A * 4/1993 Shiraiwa ........... H01L 21/67781
198/346.1
(Continued)

FOREIGN PATENT DOCUMENTS

TW           M539571 U        4/2017

OTHER PUBLICATIONS

Office Action from Taiwan Patent Application No. 105112165 dated Jan. 8, 2019.

*Primary Examiner* — Aiden Lee
(74) *Attorney, Agent, or Firm* — Patterson + Sheridan LLP

(57) ABSTRACT

Implementations described herein provide a lift pin actuator. The lift pin actuator has a housing. The housing has an interior volume. A track is disposed in the interior volume and coupled to the housing. A center shaft is at least partially disposed in the interior volume of the housing. A guide is movably coupled to the track. At least one internal bellows is disposed in the interior volume, the internal bellows form a seal between the center shaft and the housing. An elastic member is disposed in the interior volume and configured to apply a force that retracts the center shaft into the housing. An inlet port is configured to introduce fluid into the interior volume between the internal bellows and the housing. The fluid generates a force opposing the elastic member to extend the center shaft relative to the housing.

20 Claims, 4 Drawing Sheets

(56) References Cited

U.S. PATENT DOCUMENTS

| | | | | |
|---|---|---|---|---|
| 5,387,288 | A | * | 2/1995 | Shatas .................... C23C 16/511 |
| | | | | 118/665 |
| 5,950,693 | A | * | 9/1999 | Noah ........................ B01J 4/00 |
| | | | | 137/316 |
| 5,951,776 | A | * | 9/1999 | Selyutin .............. C23C 16/4583 |
| | | | | 118/729 |
| 6,305,677 | B1 | * | 10/2001 | Lenz .................... H01L 21/6831 |
| | | | | 269/13 |
| 2001/0000396 | A1 | * | 4/2001 | Dordi .................... C25D 17/12 |
| | | | | 204/212 |
| 2003/0075387 | A1 | * | 4/2003 | Wang ...................... C23C 14/50 |
| | | | | 187/250 |
| 2003/0159712 | A1 | * | 8/2003 | Blattner .................... G03F 1/82 |
| | | | | 134/2 |
| 2007/0082529 | A1 | * | 4/2007 | Nishio .............. H01L 21/67132 |
| | | | | 439/266 |
| 2012/0091108 | A1 | * | 4/2012 | Lin .................... H01L 21/67109 |
| | | | | 219/201 |
| 2014/0087561 | A1 | * | 3/2014 | Lee .................... H01L 21/68742 |
| | | | | 438/689 |

* cited by examiner

SUBSTRATE LIFT PIN ACTUATOR

CROSS-REFERENCE TO RELATED APPLICATIONS

This application claims benefit of U.S. Provisional Application Ser. No. 62/197,476, filed Jul. 27, 2015, of which is incorporated by reference in its entirety.

BACKGROUND

Field

Implementations described herein generally relate to semiconductor manufacturing and more particularly to a lift pin actuator and method of using the same.

Description of the Related Art

Device miniaturization has made small dimensions for device patterns formed in a film layer of the substrate more critical. Achieving the critical dimensions in the substrate starts with a film layer of good quality and having good adhesion to underlying film layers in the substrate. During the manufacture of the semiconductor devices, a substrate may undergo many operations in a variety of processing chambers for the purpose of forming material layers and features suitable for an end use. For example, the substrate may undergo several depositions, annealing, and etching operations, among other operations. A robot may transport the substrate onto a substrate support assembly within the processing chambers for processing therein. The substrate support assembly includes lift pins that may be actuated to space the substrate from the substrate support assembly to facilitate exchange of the substrate with the robot.

To achieve consistent good quality film on the substrates, the process equipment is maintained to reduce processing chamber environmental contamination. The actuator that displaces the lift pin may be a potential source of chamber contamination. As contamination requirements become more stringent, all sources of potential contamination must be addressed.

Therefore, there is a need for an improved pin actuator and method for using the same.

SUMMARY

Implementations described herein provide a lift pin actuator, a substrate support assembly and a method for using the same. In one embodiment, the lift pin actuator has a housing. The housing has an interior volume. A track is disposed in the interior volume and coupled to the housing. A center shaft is at least partially disposed in the interior volume of the housing. A guide is movably coupled to the track. At least one internal bellow is disposed in the interior volume, the internal bellows form a seal between the center shaft and the housing. An elastic member is disposed in the interior volume and configured to apply a force that retracts the center shaft into the housing. An inlet port is configured to introduce fluid into the interior volume between the internal bellows and the housing. The fluid generates a force opposing the elastic member to extend the center shaft relative to the housing.

In another embodiment, a substrate support assembly has a workpiece surface configured to support a substrate thereon. Lift pins are disposed through the substrate support configured to raise and lower the substrate from the workpiece surface. A lift pin actuator is coupled to the lift pins and operable to retract and extend the lift pins. The lift pin actuator has a housing. The housing has an interior volume. A track is disposed in the interior volume and coupled to the housing. A center shaft is coupled to the lift pin and at least partially disposed in the interior volume of the housing. A guide is movably coupled to the track. At least one internal bellow is disposed in the interior volume, the internal bellows form a seal between the center shaft and the housing. An elastic member is disposed in the interior volume and configured to apply a force that retracts the center shaft into the housing. An inlet port is configured to introduce fluid into the interior volume between the internal bellows and the housing. The fluid generates a force opposing the elastic member to extend the center shaft relative to the housing.

In yet another embodiment.

BRIEF DESCRIPTION OF THE DRAWINGS

So that the manner in which the above recited features of the present invention can be understood in detail, a more particular description of the invention, briefly summarized above, may be had by reference to implementations, some of which are illustrated in the appended drawings. It is to be noted, however, that the appended drawings illustrate only typical implementations of this invention and are therefore not to be considered limiting of its scope, for the invention may admit to other equally effective implementations.

To facilitate understanding, identical reference numerals have been used, where possible, to designate identical elements that are common to the figures. It is contemplated that elements disclosed in one implementation may be beneficially used in other implementations without specific recitation.

DETAILED DESCRIPTION

Implementations described herein provide a lift pin actuator which enables precise movement of the lift pins in a substrate support assembly with minimal moving parts. Moreover, in some embodiments the lift pin actuator may be provided in the substrate support assembly so that external lift actuators, electric motors and brackets may be substantially eliminated, thereby reducing cost and maintenance. Although the lift pin actuator is described below in an etch processing chamber, the lift pin actuator may be utilized in other types of plasma processing chambers, such as physical vapor deposition chambers, chemical vapor deposition chambers, ion implantation chambers, and other systems where precise movement of the lift pins is desired.

Figure 1:
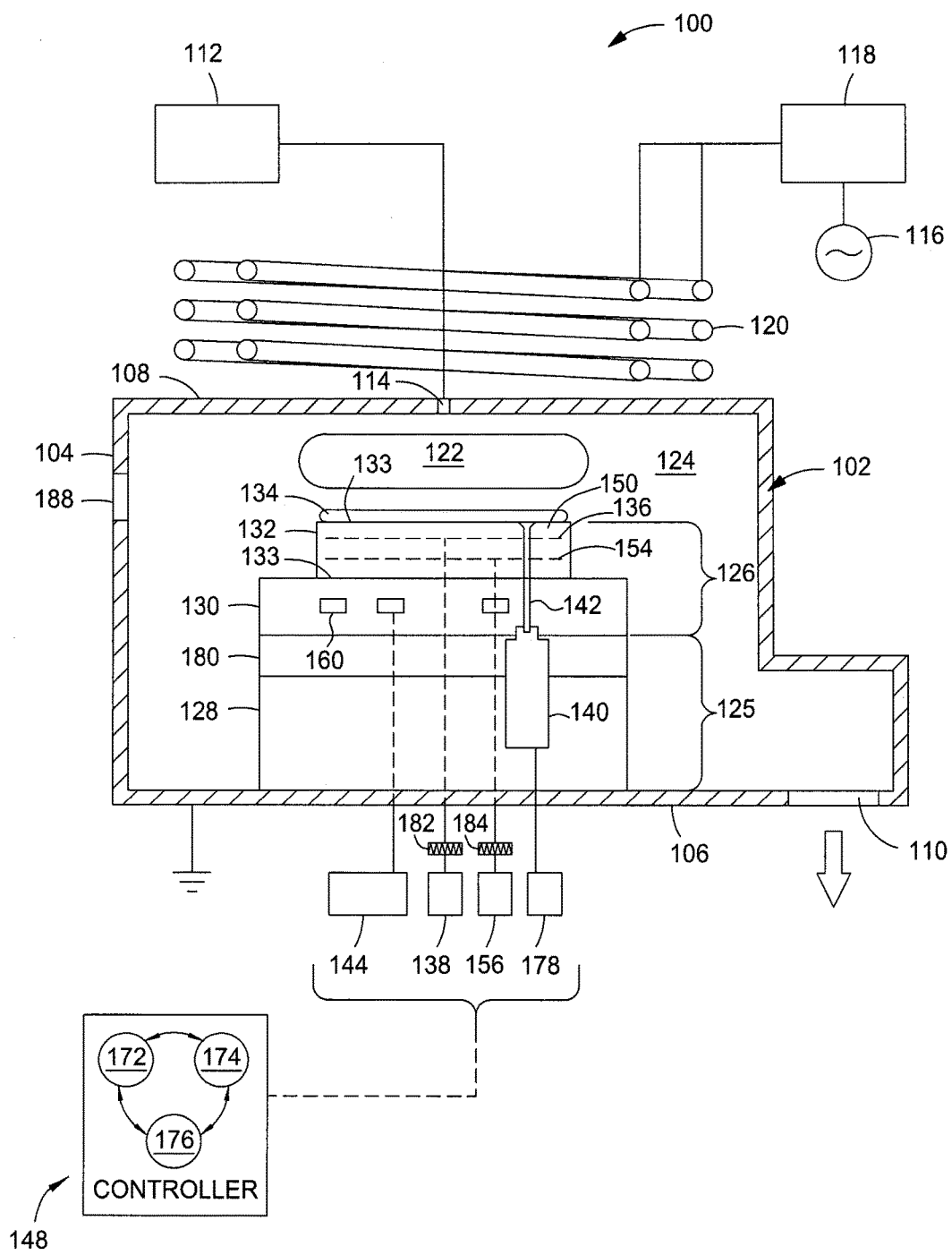
FIG. 1 is a cross-sectional schematic side view of a processing chamber having a substrate support assembly with one embodiment of a lift pin actuator.

FIG. 1 is a cross-sectional schematic side view of a processing chamber 100 having a substrate support assembly 126 with one embodiment of a lift pin actuator 140 for raising and lowering a lift pin 142. Although only one lift pin actuator 140 is depicted in FIG. 1, it is understood that a plurality of lift pin actuators 140 are disposed in an arrangement suitable foe spacing a substrate 134 from the substrate support assembly 126 during substrate transfer. As discussed above, the lift pin actuator 140 may be utilized in other processing chambers, for example plasma treatment chambers, annealing chambers, physical vapor deposition chambers, chemical vapor deposition chambers, and ion implantation chambers, as well as other systems where the ability to precisely control the lift pins with minimal moving parts is desirable.

The processing chamber 100 includes a grounded chamber body 102. The chamber body 102 includes walls 104, a bottom 106 and a lid 108 which enclose and define an internal volume 124. The substrate support assembly 126 is disposed in the internal volume 124 and is configured to support the substrate 134 thereon during processing.

The walls 104 of the processing chamber 100 include an opening 188 through which the substrate 134 may be robotically transferred into and out of the internal volume 124. A pumping port 110 is formed in one of the walls 104 or the bottom 106 of the chamber body 102 and is fluidly connected to a pumping system (not shown). The pumping system is utilized to maintain a vacuum environment within the internal volume 124 of the processing chamber 100, while removing processing byproducts.

A gas panel 112 provides process and/or other gases to the internal volume 124 of the processing chamber 100 through one or more inlet ports 114 formed through at least one of the lid 108 or walls 104 of the chamber body 102. The process gas provided by the gas panel 112 are energized within the internal volume 124 to form a plasma 122 utilized to process the substrate 134 disposed on the substrate support assembly 126. The process gases may be energized by RF power inductively coupled to the process gases from a plasma applicator 120 positioned outside the chamber body 102. In the embodiment depicted in FIG. 1, the plasma applicator 120 is a pair of coaxial coils coupled through a matching circuit 118 to an RF power source 116.

A controller 148 is coupled to the processing chamber 100 to control operation of the processing chamber 100 and processing of the substrate 134. The controller 148 may be one of any form of general-purpose data processing system that can be used in an industrial setting for controlling the various sub-processors and sub-controllers. Generally, the controller 148 includes a central processing unit (CPU) 172 in communication with memory 174 and input/output (I/O) circuitry 176, among other common components. Software commands executed by the CPU 172 of the controller 148 may operate the substrate support assembly 126 and cause the processing chamber to, for example, raise and lower the lift pins 142 via the lift pin actuators 140, introduce an etchant gas mixture (i.e., processing gas) into the internal volume 124, form the plasma 122 from the processing gas by application of RF power from the plasma applicator 120, and etch a layer of material on the substrate 134.

The substrate support assembly 126 generally includes at least a substrate support 132. The substrate support 132 may be a vacuum chuck, an electrostatic chuck, a susceptor, a heater, or other workpiece support surface. In the embodiment of FIG. 1, the substrate support 132 is depicted as an electrostatic chuck. The substrate support 132 includes lift pin holes for accommodating the lift pins 142.

The substrate support assembly 126 may also include a cooling base 130. The substrate support assembly 126 may additionally include other components not shown. The substrate support assembly 126 may be removably coupled to a support pedestal 125. The support pedestal 125 may include a pedestal base 128 and a facility plate 180. The support pedestal 125 is mounted to the chamber body 102. The substrate support assembly 126 may be periodically removed from the support pedestal 125 to allow for refurbishment of one or more components of the substrate support assembly 126.

The facility plate 180 may be disposed on the pedestal base 128 and is configured to accommodate the lift pin actuators 140. Additionally, the facility plate 180 is configured to accommodate the plurality of fluid connections from the substrate support assembly 126. The facility plate 180 is also configured to accommodate the plurality of electrical connections from the substrate support assembly 126. The myriad of connections may run externally or internally of the substrate support assembly 126 while the facility plate 180 provides an interface for the connections to a respective terminus.

The temperature controlled cooling base 130 may be disposed on the facility plate 180. The temperature controlled cooling base 130 is coupled to a heat transfer fluid source 144. The heat transfer fluid source 144 provides a heat transfer fluid, such as a liquid, gas or combination thereof, which is circulated through one or more conduits 160 disposed in the cooling base 130. The fluid flowing through neighboring conduits 160 may be isolated to enable local control of the heat transfer between the substrate support 132 and different regions of the cooling base 130, which assists in controlling the lateral temperature profile of the substrate 134.

The lift pins 142 are vertically moveable through the substrate support 132 and are configured to move the substrate 134 above a workpiece support surface 133 of the substrate support 132 for facilitating robotic transfer of the substrate 134 into and out of the processing chamber 100.

The lift pin actuator 140 are disposed below the lift pins 142 and attached thereto. The lift pin actuator 140 operates to move the lift pins 142 in a vertical direction. In one embodiment, the lift pin actuator 140 may be disposed within the internal volume 124 of the processing chamber 100. In one example, the lift pin actuator 140 may be disposed in the support pedestal 125 or the substrate support assembly 126.

In the embodiment depicted in FIG. 1, the lift pin actuator 140 may be secured to the facility plate 180 or the components of the support pedestal 125. In another embodiment, the lift pin actuator 140 may be below the support pedestal 125 and external to the processing chamber 100, such as below the chamber bottom 106.

The lift pin actuator 140 may be fluidly connected to a fluid source 178. The fluid source 178 may provide a working fluid utilized to operate to move the lift pin actuator 140 in a manner that displaces the lift pins 142 in a direction perpendicular to the plane of the workpiece support surface 133.

Figure 2:
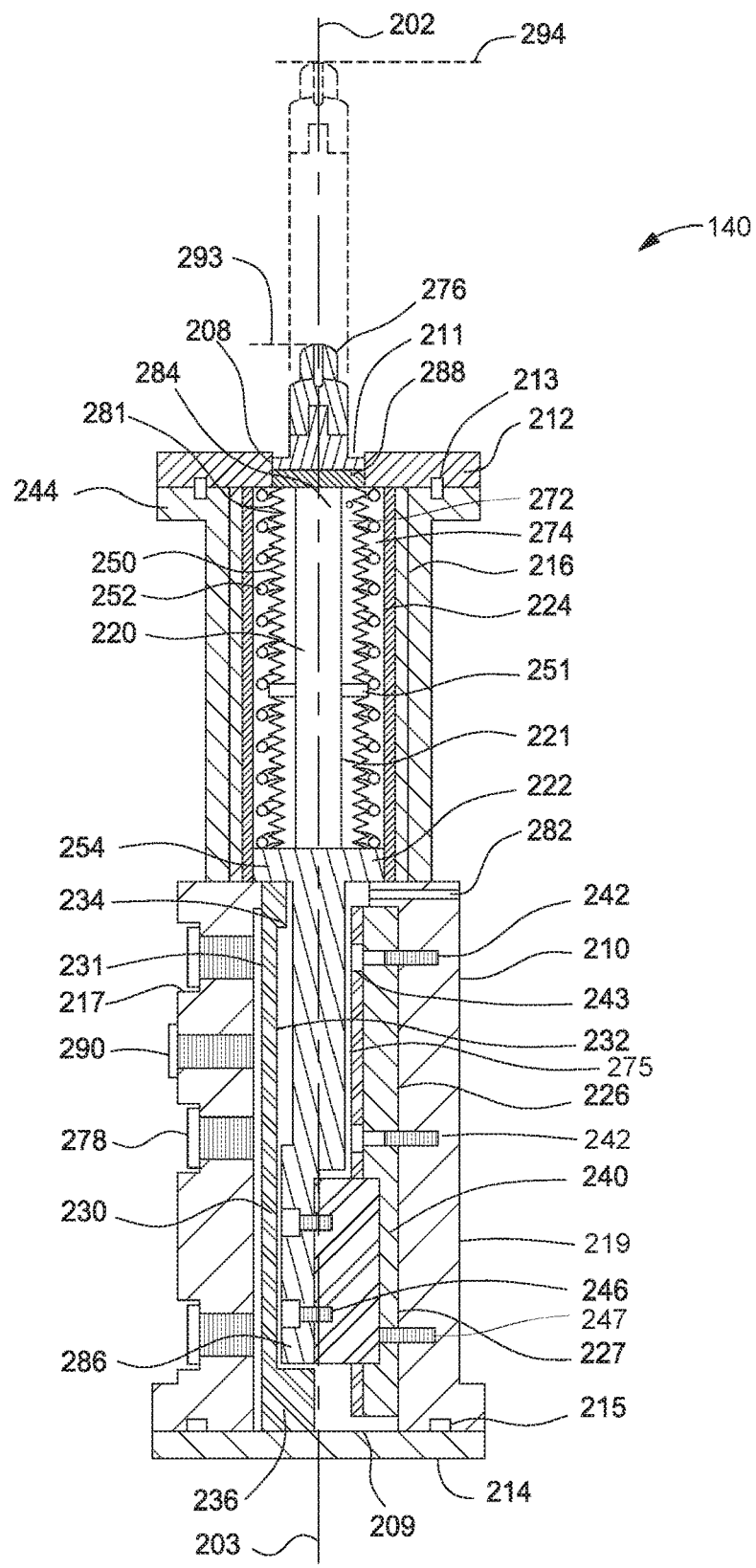
FIG. 2 is a cross-sectional schematic side view of the lift pin actuator.
Figure 3:
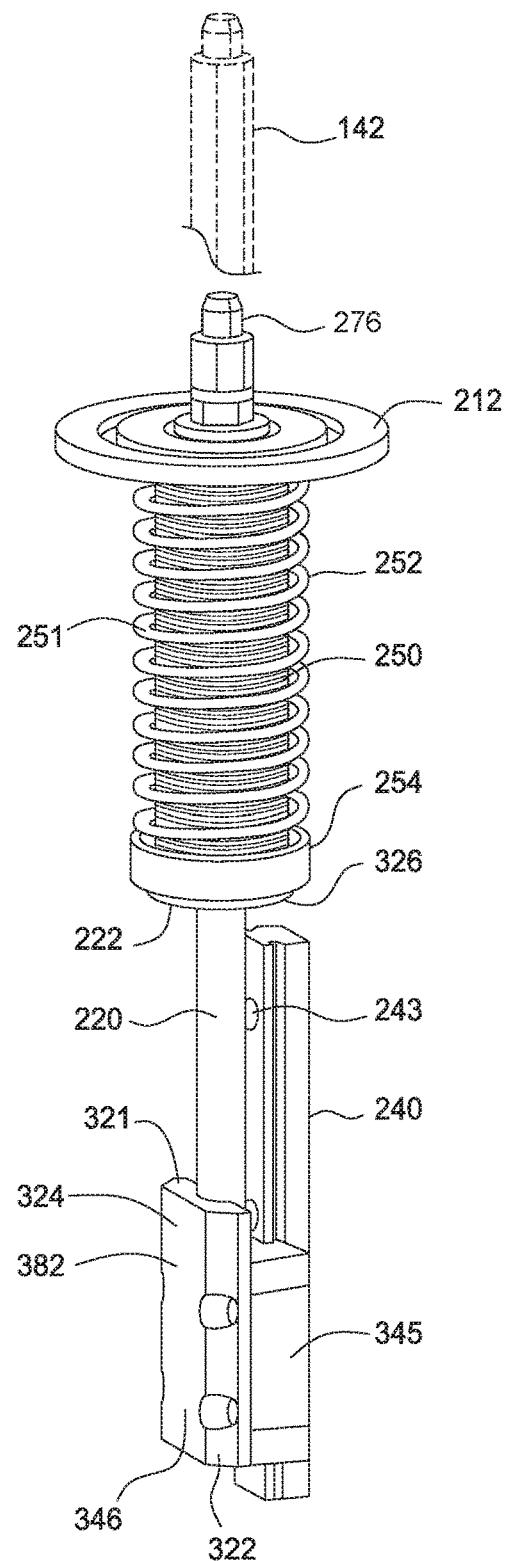
FIG. 3 is a schematic side view of the lift pin actuator with the housing of the actuator removed.

FIG. 2 and FIG. 3 provide an insight to the inner-workings of the lift pin actuator 140. FIG. 2 is a cross-sectional schematic side view of the lift pin actuator. FIG. 3 is a schematic side view of the lift pin actuator with the housing removed.

Turning first to FIG. 2, the lift pin actuator 140 has a center shaft 220 disposed in a housing 210. The housing 210 has an interior 275 and an exterior 276. A top cap 212 and a bottom cap 214 are coupled to opposite ends of the housing 210. An elastic member 252 and one or more internal bellows 250 are disposed in the interior 275 of the housing 210. The housing 210 has an inlet port 282 for coupling the lift pin actuator 140 to the fluid source 178.

The interior 275 of the housing 210 bounds an interior volume 281. The interior volume 281 of the housing 210 may have an upper portion 224 and a lower portion 226. The housing 210 may additionally have a flange 244, sidewalls 219, a top opening 208 and a bottom opening 209. Additionally, the housing 210 may have one or more apertures 217 formed therein. The flange 244 and the top opening 208 may be disposed in the upper portion 224 of the housing 210. The bottom opening and the apertures 217 may be disposed in the lower portion 226 of the housing 210. The housing 210 may be formed from metal or other suitable material. For example, the housing 210 may be formed from stainless steel or aluminum.

The flange 244 may be adapted to fasten the housing 210 to a portion of the processing chamber 100. In one embodiment, the flange 244 may mount to the chamber bottom 106 outside the internal volume of the processing chamber 100. In another embodiment, the flange 244 may mount to the facility plate 180. The flange 244 may have through holes for accepting fasteners. Alternately, the flange 244 may have fasteners formed thereon such as a keyhole type fastener, a 'T' type fastener, a threaded fastener, or other suitable fastener. In yet another alternative, the flange 244 may be adhered to the portion of the processing chamber 100 by welding, glue, or through other suitable means.

The apertures 217 may be formed in and extend through the sidewall 219 of the housing 210. The apertures 217 may permit access from the exterior to the interior 275 of the housing. A plug 278 may be configured to mate with the aperture 217. The plug 278 may be welded, glued, threaded, or fitted to the aperture 217 by any suitable technique which makes an airtight closure of the aperture 217 formed through the housing 210. In one embodiment, the apertures 217 have female threads configured to engage a male thread of the plug 278 for sealing the aperture 217.

The top cap 212 may have a center opening 211 formed therethrough. The top cap 212 is secured to the housing 210 and covers the top opening 208 of the housing 210. A gasket 213 may be disposed between the housing 210 and the top cap 212 to form an airtight seal between the top cap 212 and the housing 210 when the top cap 212 is secured to the housing 210. The bottom cap 214 is secured to and covers the bottom opening 209 of the housing 210. A gasket 215 or other seal may be disposed between the housing 210 and the bottom cap 214 for forming an airtight seal when the bottom cap 214 is secured to the housing 210. The caps 214, 212 and plugs 278 provide pressure tights seals for the housing 210.

The center shaft 220 may be disposed at least partially in the interior volume 281 of the housing 210. The center shaft 220 has a top end 284 and a bottom end 286. The top end 284 may extend through the center opening 211 in the top cap 212. A centerline 202 of the lift pin actuator 140 may be collinear with the center shaft 220. The center shaft 220 has outer diameter 221, a support flange 288, a collar 222 and a mounting portion 382. The support flange 288 and the collar 222 may extend away from the centerline 202 a distance greater than the outer diameter 221. The support flange 288 may be disposed at the top end 284 of the center shaft 220 and support a coupling 276. The coupling 276 is used to attach the lift pin actuator 140 to the lift pin 142. In this manner, the lift pin 142 is connected to the center shaft 220 and is displaced as the center shaft 220 moves within the housing 210.

The collar 222 may be ring shaped. The collar 222 extends from the outer diameter of the center shaft 220 outwards from the centerline 202. The collar 222 may have a band 254 disposed about an outer periphery 326. The band 254 may be moveably attached to the collar 222. For example, the collar 222 may have threads which mate with the threads in the band 254. Rotating the band 254 about the collar 222 may move the band 254 upwards or downwards relative to the collar 222. Alternately, the collar 222 may have a step on which the band 254 may rest upon. Bands 254 having a selected height may be used to raise or lower the band 254 relative to the collar. The relative position of the band 254 relative to the collar 222 may be selected to control the amount of axial force exerted on the center shaft 220 as further discussed below.

The internal bellows 250 are tubular in shape and have an inner area 272 and an outer area 274. In one embodiment, the internal bellows 250 are cylindrical. The internal bellows 250 may be aluminum, coated aluminum, stainless steel, or other suitable material. The materials and thickness of the internal bellows 250 is selected to allow axial deformation in an accordion fashion at operational pressure differentials. The internal bellows 250 may be disposed between the top cap 212 and the collar 222. Alternately, the internal bellows 250 may be disposed between the top cap 212 and the band 254 attached to the collar 222. The internal bellows 250 may be welded, glued or adhered to the top cap 212 and the collar 222. The internal bellows 250 may provide an air tight seal between the top cap 212 and the collar 222. A pressure differential may be present across the inner area 272 and the outer area 274 of the internal bellows 250. For example, the inner area 272 of the internal bellows 250 may be at or near a vacuum pressure, while the outer area 274 of the internal bellows 250 is at or near atmospheric pressure (ATM).

In some embodiments, two or more internal bellows 250 may be coaxially disposed within the housing 210. One or more bellow guides 251 may be disposed between the internal bellows 250. The bellow guide 251 is configured to move up and down freely inside the housing 210 while substantially remaining parallel to the collar 222 of the center shaft 220. In one embodiment, the bellow guide 251 is ring shaped. The bellow guide 251 may be formed from aluminum, stainless steel or other suitable materials. The internal bellows 250 may be sealingly attached to the bellow guides 251. For example, the internal bellows 250 may be glued or welded to the bellow guide 251. Alternately, the bellow guide 251 may be disposed in the inner area 272 of the internal bellows 250. One or more bellow guides 251 may be adhered to the internal bellow 250 at intervals to keep the internal bellows 250 substantially in column, which prolongs the life of the internal bellows 250.

The elastic member 252 may be disposed in the interior 275 of the housing 210. The elastic member 252 may be a coil spring. Alternatively, the elastic member 252 may be a bow, rubber or other suitable flexible element for generating a return force. The elastic member 252 may be compressed and or elongated to generate a force for returning to its original state. The elastic member 252 may be disposed between the top cap 212 and the band 254 attached to the collar 222 of the center shaft 220. In one embodiment, the elastic member 252 may be disposed between the internal bellows 250 and the housing 210. In another embodiment, one or more elastic members 252 may be disposed between the internal bellows 250 and the center shaft 220. In yet another embodiment, the internal bellows 250 and elastic member 252 may be a single unitary component. For example, the internal bellows 250 may be formed of a material that generates a force when compressed that biases the internal bellows 250 back to an initial length or shape prior to compression.

The elastic member 252 biases the center shaft 220 toward a retracted position 293 and away from an extended position 294. The band 254 may be axially adjusted relative the collar 222 to adjust the return for force, i.e., the compression length of the elastic member 252 when the center shaft 220 is in the retracted position 293. For example, the band 254 may be raised relative to the collar 222 to increase the return force of the elastic member 252. In one embodiment, the elastic member 252 is selected with a spring constant and compression length, while in the retracted position 293, that maintains the center shaft 220 in the retracted position 293 while overcoming about 40 pounds per square inch of vacuum force exerted on the inner area 272 of the internal bellows 250.

The mounting portion 382 may be disposed at or near the bottom end 286. An outer extent 324 of the mounting portion 382 may extend a distance greater than the outer diameter 221 from the centerline 202. Thus, the mounting portion 382 may be off center of the centerline 202. Alternately, the outer extent 324 of the mounting portion 382 may be within a distance equal to or less than the outer diameter 221 from the centerline 202. For example, a flat may be formed in the center shaft 220 to form the mounting portion 382. In one embodiment, a centerline 203 of the mounting portion 382 is offset from the centerline 202 of the center shaft 220.

The mounting portion 382 may have a top edge 321, a bottom edge 322 and one or more attachment points 346. The attachment points 346 may be a through hole for accepting a fastener such as a screw, rivet or other suitable fastener for moveably attaching the center shaft 220 to the lift pin actuator 140. Alternately, the attachment points 346 may be a glue joint, a weld, or other suitable manner of attaching the center shaft 220 to a moveable portion of the lift pin actuator 140. The top edge 321 may extend beyond the outer diameter 221 of the center shaft 220.

The mounting portion 382 of the center shaft 220 may be attached to a guide 345. The guide 345 may have attachment receivers 246. The attachment receivers 246 may operate with the attachment points 346 on the mounting portion 382 to secure the center shaft 220 to the guide 345. The attachment receivers 246 may be a hole configured to receive a fastener 247 such as a screw or rivet disposed through the attachment points 346 of the mounting portion 382 of the center shaft 220. In this manner, the center shaft 220 is secured to the guide 345. Alternately, the attachment receivers 246 may be a localized area prepared for a bonding agent, such as glue or a weld.

The guide 345 may slide on a track 240 mounted in the housing 210. The track 240 may have a shape such as a T and the guide 345 may have a complimentary shape to accept the track 240. The guide 345 and track 240 may have rollers, ball bearings or other suitable bearing contacts (not shown) between the guide 345 and track 240 to reduce friction when the guide 345 is moving along the track 240. The bearings may be spring loaded to further prevent the guide 345 from twisting, skewing or moving in a direction other than linearly down the track 240. For example, the guide 345 may have spring loaded ball bearings so that the guide 345 may move linearly along the track 240 vertically with virtually no significant lateral, pitch, roll or yawl movement. In this manner, the center shaft 220 may move between the extended position 294 and the retracted position 293 without virtually cocking, rotating, or other ancillary movement which could potentially cause the lift pin 142 to bind or rub in the lift pin holes disposed in the substrate support assembly 126. Thus, the guide 345 contributes to the reduced chamber contamination while extending the service life of the lift pins 142 and components having lift pin holes.

The track 240 may be disposed in the lower portion 226 of the interior volume 281. The track 240 may be attached to an inner surface 227 of the housing 210 with a plurality of fasteners 242 disposed through fastener locations 243 found through the track 240. The fasteners 242 may be screw type fasteners or other suitable fasteners. The apertures 217 in the housing may significantly align with the fastener locations 243. The apertures 217 may provide access to the fasteners 242 used to secure the track 240 to the housing. The apertures 217 may additionally, provide access to the fasteners 247 attaching the mounting portion 382 of the center shaft 220 to the guide 345. For example, the plugs 278 may be temporarily removed from the apertures 217 to gain access to the fasteners 247, 242 for installing or removing the track 240 or center shaft 220.

A guide stop 230 may be disposed in the lower portion 226 of the housing 210. The guide stop 230 may be formed from a metal, plastic or other suitable material. The guide stop 230 may have an outer surface 231 and an inner surface 232. The guide stop 230 may have an upper hard stop 234. Additionally, the guide stop 230 may have a lower hard stop 236. The upper and lower hard stop 234, 236 may extend toward the centerline 202 from the inner surface 232 of the guide stop 230. The upper hard stop 234 may prevent the guide 345 from traveling in an upward direction along the track 240 further than the upper hard stop 234. The upper hard stop 234 contacts the guide 345 when the center shaft 220 is in the extended position 294 and prevents further upward movement of the center shaft 220. The lower hard stop 236 may prevent the guide 345 from traveling in a downward direction along the track 240 further than the lower hard stop 236. The lower hard stop 236 contacts the guide 345 when the center shaft 220 is in the retracted position 293 and prevents further downward movement of the center shaft 220. Thus, the upper and lower hard stops 234, 236 limit the travel of the guide 345 along the track 240, which limits the movement of the center shaft 220 relative to the housing 210.

A sleeve 216 may be disposed in the upper portion 224 of the housing 210. The sleeve 216 may be formed from a plastic, a smooth material, or other friction reducing material. The sleeve 216 may reduce friction between the center shaft 220, the elastic member 252, the bellow guide 251, and the band 254 in the upper portion 224 of the housing 210. The sleeve 216 may also help to improve the fit between the band 254 attached to the collar 222 of the center shaft 220 and the housing 210. In this manner, the sleeve 216 advantageously substantially prevents the center shaft 220 from moving in any directions other than linearly between the retracted position 293 and the extended position 294.

A sensor 290 may be utilized to indicate the position of the guide 345 along the track 240. The sensor 290 may alternately indicate if the center shaft 220 is in the extended position 294 or the retracted position 293. The sensor 290 may be a proximity sensor, proximity sensor, reed switch, magnetic sensor, hall effect switch, limit switch or other suitable device for determining the location of the of the center shaft 220 relative to the housing 210. The sensor 290 may be mounted to the housing 210. The sensor 290 may determine the position of the center shaft 220 using a magnetic field or other method without extending into the interior volume 281 of the housing 210. Alternately, the sensor 290 may be present in the interior volume 281 of the housing 210. In yet another alternative, the sensor 290 may be located external to the housing 210.

The inlet port 282 may be disposed through the housing 210 and fluidly connected with the interior volume 281 of the housing 210 that is enclosed and sealed by the plugs 278, caps 212, 214 and the internal bellows 250. The inlet port 282 is coupled to the fluid source 178. The fluid provided through the inlet port 282 is prevented from entering the inner area 272 of the internal bellows 250 by the airtight seal formed by the internal bellows 250 between the center shaft 220 and the housing 210. Thus fluid entering through the inlet port 282 increase the pressure in a portion of the interior volume 281 exterior to the inner area 272 of the internal bellows 250. The increased fluid pressure creates an upward force on the collar 222. Further increasing the fluid pressure to overcome the force of the elastic member 252 causes the center shaft 220 to move upward until the guide 345 contacts the upper hard stop 234. Tuning of the force generated by the elastic member 252 may be performed by moving the band 254 along the collar 222 to compress or loosen the elastic member 252. Fluid may be removed from the interior volume 281 of the housing 210 through the inlet port 282, allowing the force generated by the elastic member 252 to move the center shaft 220 downward until the guide 345 contacts the lower hard stop 236. Thus, movement of the center shaft 220 between the retracted position 293 and the extended position 294 is facilitated by moving fluid into and out of the interior volume 281 of the housing 210 through the inlet port 282.

The internal bellows 250 isolates and protects the components of the lift pin actuator 140 from the chamber environment. Advantageously, the internal bellows 250 and elastic member 252 operate to displace the lift pins 142 without the need for conventional lift actuators, moving brackets, electric motors, or the like. The lift pin actuator 140 moves each lift pin 142 in the vertical direction more precisely than conventional arrangements as there are less moving parts for moving the lift pins up and down. The spring loaded guide 345 of the lift pin actuator 140 substantially minimize the side play or angular misalignment of the lift pins 142, which leads to wear and particulate generation in the conventional design. The guide 345 and track 240 substantially minimize non-axial movements of the center shaft. Thus, the lift pin actuator 140 leads to better precision in the X/Y direction for the lift pins 142 as the lift pins 142 are raised and lowered in the Z direction as the center shaft 220 moves between the extended and retracted positions 293, 294. The guide 345 and track 240 also prevents the center shaft 220 from rotating and thus the internal bellows 250 are not subjected to torsional forces which could lead to damage or shorten the service life of the internal bellows 250. Therefore, operational downtime to clean the chamber and maintain the assortment of components used for moving the lift pins 142 is reduced, thereby reducing operation costs and increasing production capacity.

Figure 4:
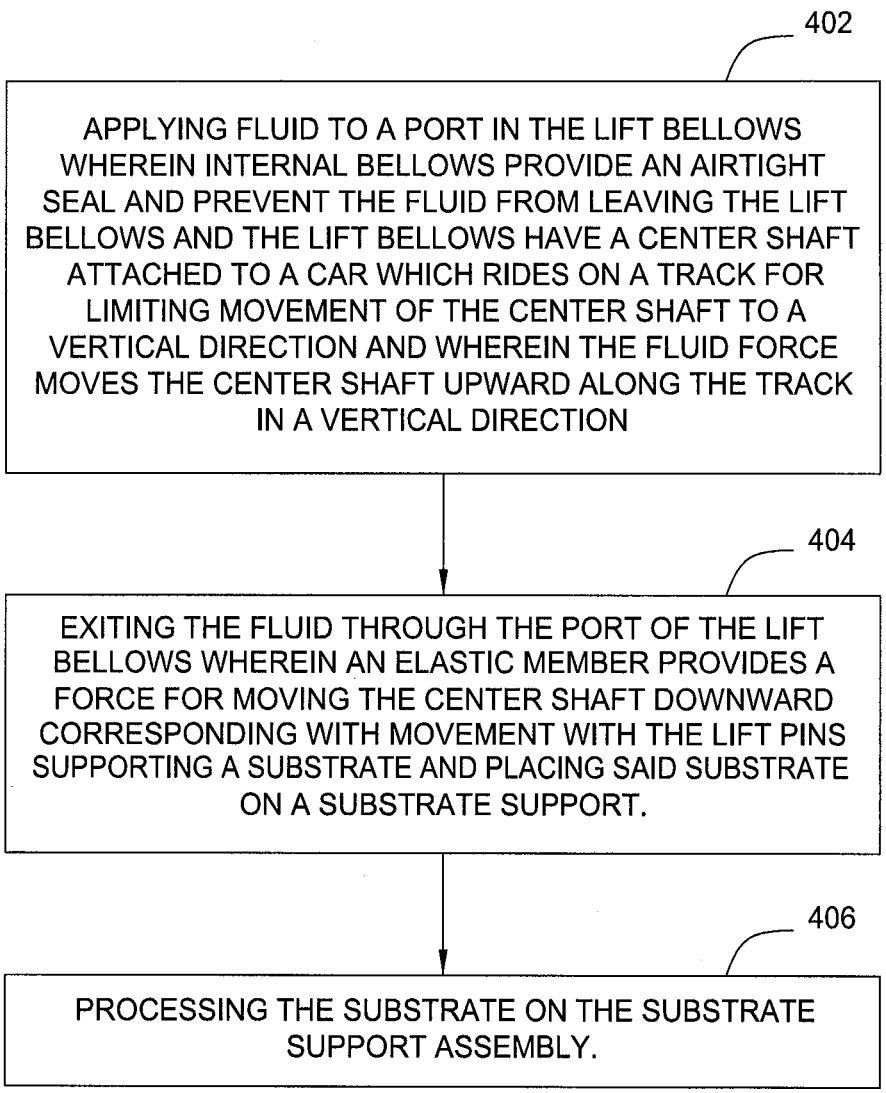
FIG. 4 is a method for processing a substrate utilizing a substrate support assembly having a lift pin actuator.

FIG. 4 is a flow diagram for one embodiment of a method 400 for processing a substrate utilizing a substrate support assembly having lift pin actuator, such as the lift pin actuator described above, among others. The method 400 begins at block 402 by applying fluid to a port in the lift pin actuator. Internal bellows provide an airtight seal and prevent the fluid from entering the chamber. The lift pin actuator has a center shaft attached to a guide which rides on a track for limiting movement of the center shaft to a vertical direction. The movement of the guide in response to the fluid being applied to the port is opposed by an elastic member. The fluid creates a force greater than the force supplied by the elastic member, which moves the center shaft upward along the track in a vertical direction. The center shaft continues to move until reaching a fully extended position when the guide attached to the center shaft contacts an upper hard stop. The center shaft extends the lift pins attached thereto above a workpiece surface of a substrate support. A substrate is set on the extended lift pins by a substrate transfer robot.

At block 404, the fluid is permitted to exit the port of the housing. The elastic member provides a force for moving the center shaft downward against the vacuum force. The guide attached to the center shaft rides along the track downward until coming into contact with the lower hard stop. The lower stop halts the center shaft upon the center shaft reaches the lowered position. The downward movement of the center shaft correspondingly retracts the lift pins into the substrate support assembly. The lift pins supporting the substrate retract below the workpiece supporting surface upon the center shaft reaching the lowered position, thereby transferring the substrate to the workpiece support surface.

At block 406, the substrate, is processed on the substrate support assembly. For example, the substrate may be processed in a vacuum chamber in which the substrate support assembly resides. The substrate may be processed in a vacuum while exposed to a plasma. The process performed on one of the substrates in the presence of a plasma within the processing chamber may be one of etching, chemical vapor deposition, physical vapor deposition, ion implantation, plasma treating, annealing, oxide removal, abatement or other plasma process. It is contemplated that the substrate may be processed on the temperature controlled surface in other environments, for example, at atmospheric conditions, for other applications.

While the foregoing is directed to implementations of the present invention, other and further implementations of the invention may be devised without departing from the basic scope thereof, and the scope thereof is determined by the claims that follow.

We claim:

1. A lift pin actuator, comprising:
a housing having an interior volume;
a track disposed in the interior volume and coupled to the housing;
a center shaft at least partially disposed in the interior volume;
a guide stop extending along the track in the interior volume, the guide stop having an upper hard stop and a lower hard stop;
a guide configured to:
secure the center shaft; and
slide on the track between a first position and a second position;
at least one internal bellows disposed in the interior volume, the internal bellows forming a seal between the center shaft and the housing;
an elastic member disposed in the interior volume and configured to apply an elastic force that retracts the center shaft into the housing; and
an inlet port configured to introduce fluid into the interior volume between the internal bellows and the housing that generates a fluid force opposing the elastic member to extend the center shaft relative to the housing.

2. The lift pin actuator of claim 1, further comprising:
a band disposed on the center shaft, a position of the band relative to the center shaft adjustable to adjust the elastic force exerted on the center shaft by the elastic member.

3. The lift pin actuator of claim 1, wherein the at least one internal bellows comprises at least two axially aligned internal bellows.

4. The lift pin actuator of claim 3, further comprising:
a bellows guide disposed between adjacent internal bellows, the bellows guide configured to maintain axial alignment of the internal bellows relative to the housing.

5. The lift pin actuator of claim 1, further comprising:
a sleeve disposed between the elastic member and the housing.

6. The lift pin actuator of claim 1, wherein bearings of the guide are spring loaded.

7. The lift pin actuator of claim 1, further comprising:
a sensor coupled to the housing, the sensor configured to provide a metric indicative of a position of the center shaft.

8. The lift pin actuator of claim 1, wherein the housing further comprises:
apertures for providing access to fasteners for mounting the track to the housing; and
removable plugs sealing disposed in the apertures.

9. A substrate support assembly, comprising:
a substrate support having a workpiece surface configured to support a substrate thereon;
a lift pin disposed through the substrate support configured to raise and lower the substrate from the workpiece surface; and
a lift pin actuator coupled to the lift pin and operable to retract and extend the lift pin, the lift pin actuator further comprising:
a housing having an interior volume;
a track disposed in the interior volume and coupled to the housing;
a center shaft coupled to the lift pin and at least partially disposed in the interior volume;
a guide stop extending along the track in the interior volume, the guide stop having an upper hard stop and a lower hard stop;
a guide configured to:
secure the center shaft; and
slide on the track between a first position and a second position;
at least one internal bellows disposed in the interior volume, the internal bellows forming a seal between the center shaft and the housing;
an elastic member disposed in the interior volume and configured to apply an elastic force that retracts the center shaft into the housing; and
an inlet port configured to introduce fluid into the interior volume between the internal bellows and the housing that generates a fluid force opposing the elastic member to extend the center shaft relative to the housing.

10. The substrate support assembly of claim 9, further comprising:
a pedestal assembly, wherein the pedestal assembly comprises:
a base; and
a facility plate disposed between the base and the substrate support.

11. The substrate support assembly of claim 10, wherein the lift pin actuator is disposed inside the pedestal assembly of the substrate support assembly.

12. The substrate support assembly of claim 10, wherein the lift pin actuator is disposed below the pedestal assembly of the substrate support assembly.

13. The substrate support assembly of claim 9, further comprising:
a band disposed on the center shaft, a position of the band relative to the center shaft adjustable to adjust the elastic force exerted on the center shaft by the elastic member.

14. The substrate support assembly of claim 9, wherein the at least one internal bellows comprises at least two axially aligned internal bellows.

15. The substrate support assembly of claim 14, further comprising:
a bellows guide disposed between adjacent internal bellows, the bellows guide configured to maintain axial alignment of the internal bellows relative to the housing.

16. The substrate support assembly of claim 9, further comprising:
a sleeve disposed between the elastic member and the housing.

17. The substrate support assembly of claim 9, wherein bearings of the guide are spring loaded.

18. The substrate support assembly of claim 9, further comprising:
a sensor coupled to the housing, the sensor configured to provide a metric indicative of a position of the center shaft.

19. The substrate support assembly of claim 9, wherein the housing further comprises:
apertures for providing access to fasteners for mounting the track to the housing; and
removable plugs sealing disposed in the apertures.

20. The lift pin actuator of claim 1, wherein the guide is configured to contact the upper hard stop at the first position and the lower hard stop at the second position.

* * * * *